(12) United States Patent
Lo et al.

(10) Patent No.: US 11,152,551 B2
(45) Date of Patent: Oct. 19, 2021

(54) ELECTRONIC DEVICE

(71) Applicant: InnoLux Corporation, Miao-Li County (TW)

(72) Inventors: Min-Hsin Lo, Miao-Li County (TW); Ker-Yih Kao, Miao-Li County (TW); Ming-Chun Tseng, Miao-Li County (TW); Hung-Sheng Liao, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 107 days.

(21) Appl. No.: 16/384,948

(22) Filed: Apr. 16, 2019

(65) Prior Publication Data
US 2019/0334067 A1 Oct. 31, 2019

Related U.S. Application Data

(60) Provisional application No. 62/663,275, filed on Apr. 27, 2018.

(30) Foreign Application Priority Data

Oct. 15, 2018 (CN) .......................... 201811197891.9

(51) Int. Cl.
*H01L 33/62* (2010.01)
*H01L 23/00* (2006.01)
*H01L 27/15* (2006.01)

(52) U.S. Cl.
CPC .............. *H01L 33/62* (2013.01); *H01L 24/10* (2013.01); *H01L 24/81* (2013.01); *H01L 27/153* (2013.01); *H01L 2224/0401* (2013.01)

(58) Field of Classification Search
CPC ......... H01L 33/08; H01L 33/18; H01L 33/20; H01L 33/24; H01L 33/38–387;
(Continued)

(56) References Cited

U.S. PATENT DOCUMENTS

2005/0072835 A1 4/2005 Choi
2008/0043160 A1* 2/2008 Park .................. G02F 1/133555
349/38
(Continued)

FOREIGN PATENT DOCUMENTS

CN 100413632 C 8/2008
CN 203812914 U 9/2014
(Continued)

*Primary Examiner* — Farun Lu
(74) *Attorney, Agent, or Firm* — Winston Hsu

(57) ABSTRACT

The present disclosure provides an electronic device providing a substrate, a first circuit, a plurality of bonding pads and a light emitting unit. The first circuit is disposed on the substrate. The bonding pads are disposed on the substrate, wherein at least one of the bonding pads includes a bonding part and a connecting part, and the bonding part is electrically connected to the first circuit through the connecting part. The light emitting unit is disposed on the substrate and corresponding to the bonding part, and the light emitting unit is electrically connected to the first circuit through at least one of the bonding pads. At least a portion of the first circuit is located between two of the bonding pads in a top view.

19 Claims, 12 Drawing Sheets

(58) Field of Classification Search
CPC ............... H01L 33/44; H01L 33/62; H01L 2224/48091; H01L 2224/16145; H01L 2224/73257; H01L 27/153
See application file for complete search history.

(56) References Cited

U.S. PATENT DOCUMENTS

| | | | |
|---|---|---|---|
| 2011/0298843 A1* | 12/2011 | Hajjar | G09G 3/2003 345/690 |
| 2012/0193785 A1* | 8/2012 | Lin | H01L 24/97 257/737 |
| 2016/0035265 A1* | 2/2016 | Park | G09G 3/2003 345/694 |
| 2017/0133356 A1* | 5/2017 | Mercier | H01L 33/24 |
| 2017/0186781 A1* | 6/2017 | Noh | H01L 27/1288 |

FOREIGN PATENT DOCUMENTS

| | | |
|---|---|---|
| CN | 106663680 A | 5/2017 |
| CN | 107302011 A | 10/2017 |
| CN | 107437551 A | 12/2017 |

* cited by examiner

ELECTRONIC DEVICE

CROSS REFERENCE TO RELATED APPLICATION

This patent application claims the benefit of U.S. provisional application No. 62/663,275, filed Apr. 27, 2018, and claims the priority benefit of China Application Serial No. 201811197891.9, which was filed on Oct. 15, 2018, and the entire contents of which are incorporated herein by reference.

BACKGROUND OF THE DISCLOSURE

1. Field of the Disclosure

The present disclosure relates to an electronic device, and more particularly to an electronic device in which the possibility of crushed damage of a circuit can be reduced.

2. Description of the Prior Art

As the evolution and development of electronic devices, the electronic devices are widely used and have become indispensable items nowadays. In general, the electronic device may have a light emitting component such as a light-emitting diode (LED). However, during a bonding process of the light emitting component, a step for disposing the light emitting component on the substrate and/or a heating step may be performed. These steps may damage the circuit located under the light emitting component, for instance, the electronic component(s), such as transistor(s), capacitor(s), etc., of the circuit may be damaged. As the result, the yield rate of the electronic device is decreased. Therefore, the electronic device needs an improvement for the issue mentioned above.

SUMMARY OF THE DISCLOSURE

In an embodiment, the present disclosure provides an electronic device including a substrate, a first circuit, a plurality of bonding pads and a light emitting unit. The first circuit is disposed on the substrate. The bonding pads are disposed on the substrate, wherein at least one of the bonding pads includes a bonding part and a connecting part, and the bonding part is electrically connected to the first circuit through the connecting part. The light emitting unit is disposed on the substrate and corresponds to the bonding part, and the light emitting unit is electrically connected to the first circuit through at least one of the bonding pads. At least a portion of the first circuit is located between two of the bonding pads in a top view.

These and other objectives of the present disclosure will no doubt become obvious to those of ordinary skill in the art after reading the following detailed description of the embodiment that is illustrated in the various figures and drawings.

DETAILED DESCRIPTION

Figure 1:
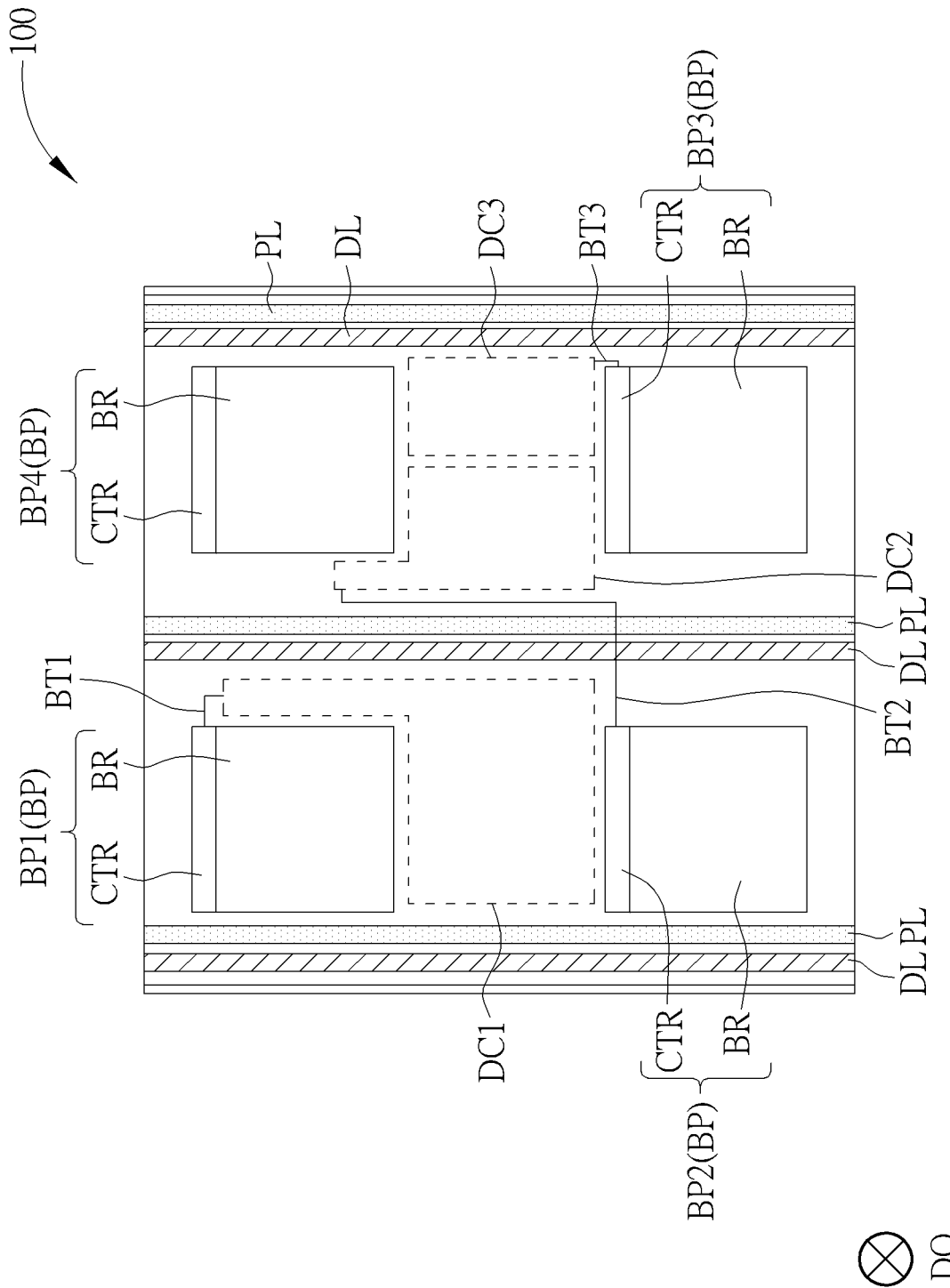
FIG. 1 is a schematic diagram showing a top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When the corresponding component such as layer or area is referred to "on another component (or the variant thereof)", "connected to another component" or "extend to another component", it may be directly on another component, be directly connected to another component, directly extend to another component, or other component may exist between them. On the other hand, when the component is referred to "directly on another component (or the variant thereof)", "be directly connected to another component" or "directly extend to another component", any component does not exist between them. In addition, when the component is referred to "be coupled to/with another component (or the variant thereof)", it may be directly connected to another component, or may be indirectly connected (such as electrically connected) to another component through other component or components.

When the terms "about", "approximate" and "approximately" are used in the description of the present disclosure, these terms can indicate a value of a given quantity that varies within 20% of the value, within 10% of the value, within 5% of the value, within 3% of the value, within 2% of the value, within 1% of the value or within 0.5% of the value. In addition, a given quantity in this description is an approximately quantity; that is to say, under a condition that the terms "about", "approximate" and "approximately" are absent, the meanings of "about", "approximate" and "approximately" may still be implied.

It should be noted that the technical features in different embodiments described in the following can be replaced, recombined, or mixed with one another to constitute another embodiment without departing from the spirit of the present disclosure.

Herein, an electronic device will be described below. In the present disclosure, the electronic device may be any suitable type of the electronic device. For instance, the electronic device may be a light emitting structure, a backlight module, a display device, a tiling electronic device, a sensing device or an antenna, but not limited thereto.

Figure 2:
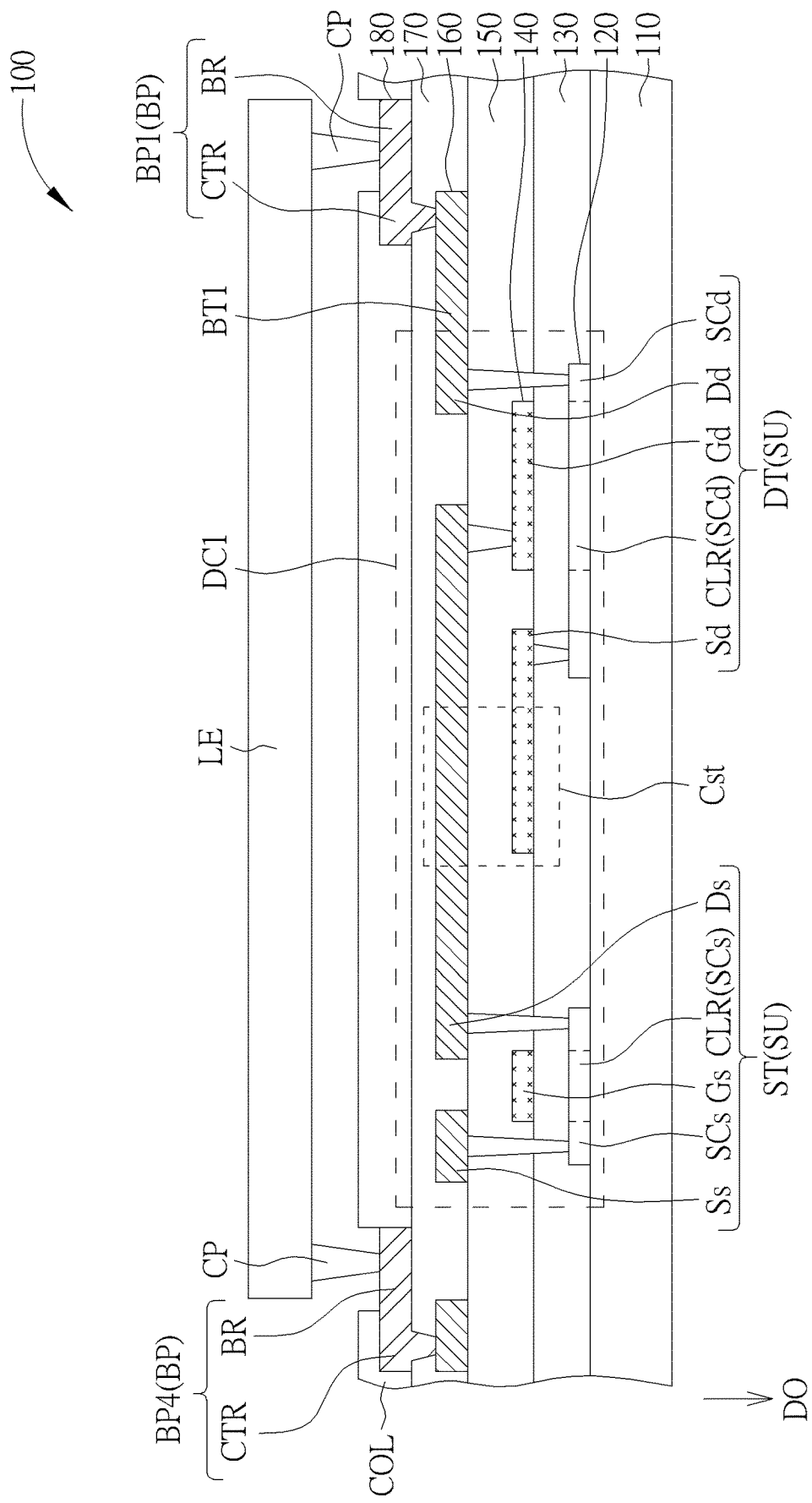
FIG. 2 is a schematic diagram showing a cross-sectional view of the electronic device according to the first embodiment of the present disclosure.
Figure 3:
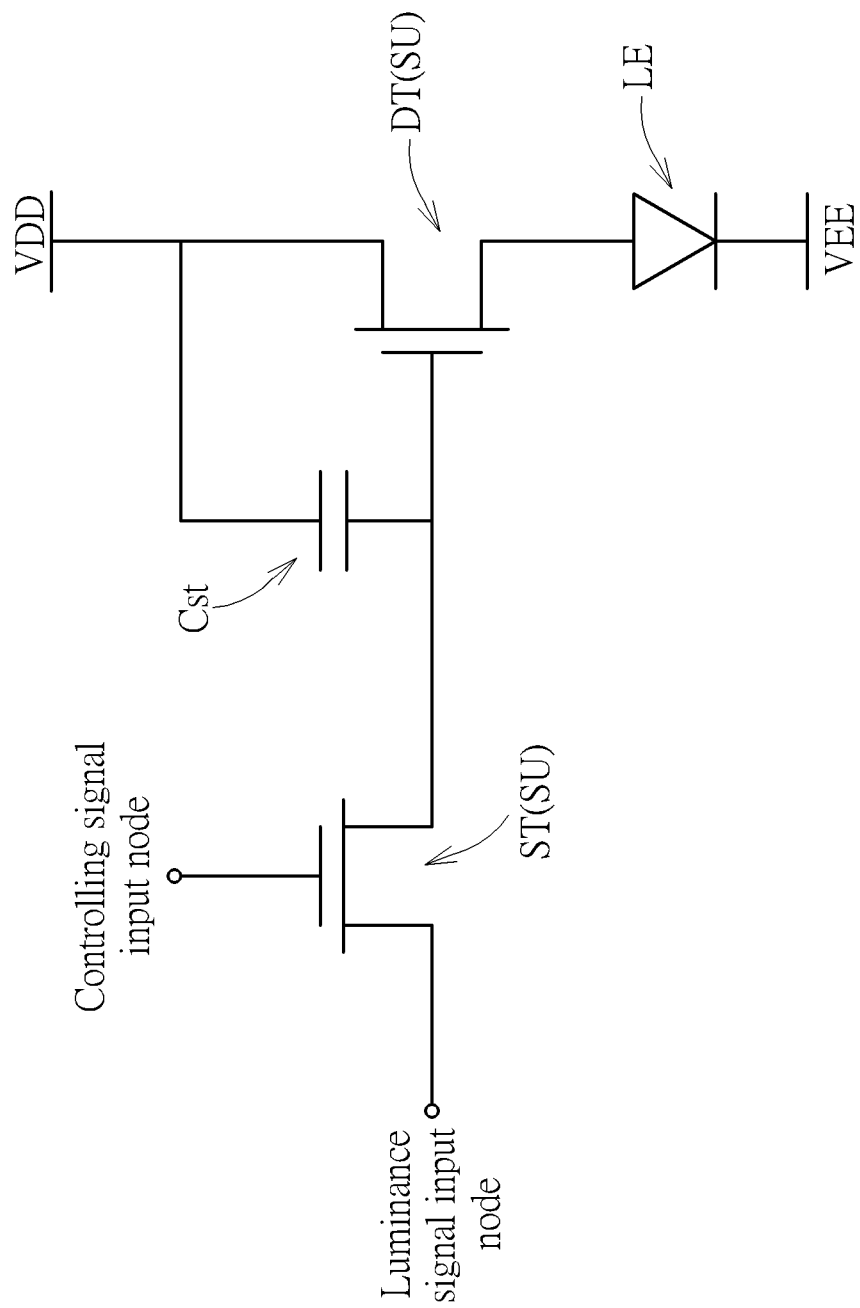
FIG. 3 is a circuit diagram showing a light emitting unit and a first circuit according to the first embodiment of the present disclosure.

Referring to FIG. 1 to FIG. 3, FIG. 1 is a schematic diagram showing a top view of an electronic device according to a first embodiment of the present disclosure, FIG. 2 is a schematic diagram showing a cross-sectional view of the electronic device according to the first embodiment of the present disclosure, FIG. 3 is a circuit diagram showing a light emitting unit and a first circuit according to the first embodiment of the present disclosure. The electronic device of this embodiment is a light emitting structure 100. For example, the light emitting structure 100 may be a display device configured to display images or a light emitting module configured to generate light, but the present disclosure is not limited thereto. The light emitting structure 100 may include at least one structure unit for emitting light. The light emitting structure 100 of this embodiment may be a display device, and may include a plurality of structure units. In order to clearly show the structure units, FIG. 1 to FIG. 3 show one structure unit, and it omits a light emitting unit in FIG. 1, but the present disclosure is not limited thereto. As shown in FIG. 1 to FIG. 3, one structure unit of the light emitting structure 100 of this embodiment includes a substrate 110, a plurality of bonding pads BP and a light emitting unit LE, and the bonding pads BP and the light emitting unit LE are disposed on the substrate 110. The light emitting unit LE may be such as a light-emitting diode (LED), a micro-light-emitting diode (micro-LED), a mini-light-emitting diode (mini-LED), an organic light-emitting diode (OLED), a quantum-dot light-emitting diode (QLED), any other suitable light emitting unit or a combination thereof, and the light emitting unit LE may emit a monochromatic light (e.g., red light, green light or blue light) or a mixed light (e.g., white light). For instance, the light emitting unit LE of this embodiment may include such as a blue light-emitting diode chip (not shown in figures), a green light-emitting diode chip (not shown in figures) and a red light-emitting diode chip (not shown in figures), such that the white light can be mixed to generate. Furthermore, the light emitting unit LE may exemplarily have four bumps CP connected to the substrate, such that an electrical signal may be transmitted to the light emitting unit LE, wherein three of the bumps CP are electrically connected to an anode of the blue light-emitting diode chip, an anode of the green light-emitting diode chip and an anode of the red light-emitting diode chip respectively, and the last one of the bumps CP may be a common cathode electrically connected to cathodes of these three light-emitting diode chips, but not limited thereto.

The structure unit of the light emitting structure 100 may include various layers (e.g., at least one insulating layer, at least one conductive layer and/or at least one the semiconductor layer), conductive lines and electronic components (i.e., at least one active component and/or at least one passive component, such as at least one transistor, at least one capacitor, at least one resistor, etc.) which are disposed on the substrate 110. The material of the substrate 110 may include glass, quartz, sapphire, polyimide (PI), polyethylene terephthalate (PET) and/or any other suitable material, so the substrate 110 may be served as a flexible substrate or a hard substrate, but the material is not limited thereto. In this embodiment, a semiconductor layer 120, a first insulating layer 130, a first conductive layer 140, a second insulating layer 150, a second conductive layer 160, a third insulating layer 170 and a third conductive layer 180 may be disposed on the substrate 110 in a stacking sequence (from down to top in FIG. 2), but the stacking sequence of the layers included in the light emitting structure 100 are not limited thereto. In another embodiment, any other insulating layer, any other conductive layer and/or any other semiconductor layer may be disposed between any two of the above layers additionally, and the stacking sequence of the layers may be changed based on designs. The disposed insulating layer (e.g., the first insulating layer 130, the second insulating layer 150 and the third insulating layer 170) may include such as silicon oxide, silicon nitride, silicon oxynitride, any other suitable insulating material or a combination thereof. The disposed conductive layer (e.g., the first conductive layer 140, the second conductive layer 160 and the third conductive layer 180) may include such as metal material, transparent conductive material (e.g., indium tin oxide (ITO), indium zinc oxide (IZO), etc.), any other suitable conductive material or a combination thereof.

The first circuit DC1 may comprise at least one of above layers, so as to drive the light emitting unit LE to generate the light with a demanded light intensity. The first circuit DC1 of this embodiment may include two switching components SU (i.e., a driving transistor DT and a switching transistor ST) and a capacitor Cst. For instance, one electrode of the capacitor Cst, a drain electrode Dd of the driving transistor DT and a source electrode Ss and a drain electrode Ds of the switching transistor ST comprise the second conductive layer 160, the other electrode of the capacitor Cst, a gate electrode Gs of the switching transistor ST, and a gate electrode Gd and a source electrode Sd of the driving transistor DT comprise the first conductive layer 140, a channel layer SCd of the driving transistor DT and a channel layer SCs of the switching transistor ST comprise the semiconductor layer 120, and the channel layers SCd, SCs have a channel region CLR respectively corresponding to the gate electrodes Gd, Gs. In this case, one of the source electrode Ss and the drain electrode Ds of the switching transistor ST (e.g., the drain electrode Ds in FIG. 2) is electrically connected to the gate electrode Gd of the driving transistor DT and the capacitor Cst, the other one of the source electrode Ss and the drain electrode Ds of the switching transistor ST (e.g., the source electrode Ss in FIG. 2) may be a luminance signal input node (for example, the luminance signal input node receives a luminance signal by being electrically connected to a luminance controlling chip), the gate electrode Gs of the switching transistor ST may be a controlling signal input node (for example, the controlling signal input node receives a gate controlling signal by being electrically connected to a gate switch controlling chip), one of the source electrode Sd and the drain electrode Dd of the driving transistor DT (e.g., the source electrode Sd in FIG. 2) is electrically connected to a power source VDD and the capacitor Cst. The other one of the source electrode Sd and the drain electrode Dd of the driving transistor DT (the drain electrode Dd in FIG. 2) is electrically connected to the light emitting unit LE, but the disposition and the connection are not limited thereto. In another embodiment, the first circuit DC1 may further include any other switching component SU, any other capacitor or any other suitable electronic component, and the first circuit DC1 may further have any other function, such as a compensating function. In this embodiment, optionally, a second circuit DC2 and a third circuit DC3 configured to drive the light emitting unit LE may comprise at least one of above layers, wherein the second circuit DC2 and the third circuit DC3 are electrically connected to the light emitting unit LE, and the circuit design of the second circuit DC2 and the circuit design of the third circuit DC3 may be the same as or different from the first circuit DC1. For example, in this embodiment, the first circuit DC1 may be electrically connected to the anode of the blue light-emitting diode chip (not shown in figure) in the light emitting unit LE, the second circuit DC2 may be electrically connected to the anode of the green light-emitting diode chip (not shown in figure) in the light emitting unit LE, and the third circuit DC3 may be electrically connected to the anode of the red light-emitting diode chip (not shown in figure) in the light emitting unit LE, but not limited thereto. Moreover, in this embodiment, the first circuit DC1, the second circuit DC2 and the third circuit DC3 may be driving circuits in an active matrix circuit of the electronic device (e.g., the display device) configured to drive the light emitting unit LE, but not limited thereto. Note that, in FIG. 1, it omits electronic components and wirings of the first circuit DC1, the second circuit DC2 and the third circuit DC3, so as to clearly show the disposing ranges of the first circuit DC1, the second circuit DC2 and the third circuit DC3. In some embodiments of the present disclosure, the disposing ranges of at least one of the first circuit DC1, the second circuit DC2 or the third circuit DC3 may include the positions of its electronic components (e.g., the transistor, the resistor, the capacitor, etc.) and the positions of its wirings electrically connected between the electronic components, but not limited thereto.

Furthermore, in this embodiment, a plurality of connecting lines may comprise at least one of above layers, and the connecting lines include such as data lines DL, scan lines and power lines PL, wherein the luminance controlling chip may be electrically connected to the first circuit DC1, the second circuit DC2 and the third circuit DC3 (e.g., the source electrodes Ss of their switching transistors ST) through the data lines DL respectively, the gate switch controlling chip may be electrically connected to the first circuit DC1, the second circuit DC2 and the third circuit DC3 (e.g., the gate electrodes Gs of their switching transistors ST) through the scan lines respectively, and the power source VDD may be electrically connected to the light emitting unit LE through at least one of the power lines PL (for example, the power source VDD may be electrically connected to the blue light-emitting diode chip, the green light-emitting diode chip and the red light-emitting diode chip in the light emitting unit LE through the power lines PL), so as to provide the light emitting unit LE with a voltage or a current. For instance, the data lines DL and the power lines PL may comprise the second conductive layer 160, and the scan lines may comprise the first conductive layer 140, but not limited thereto.

The bonding pads BP is configured to make the light emitting unit LE be electrically connected to the circuit on the substrate 110, and the bonding pads BP may comprise the third conductive layer 180 for example. In the present disclosure, at least one of the bonding pads BP includes a bonding part BR and a connecting part CTR electrically connected to each other, wherein the bonding part BR is corresponding to the light emitting unit LE and is configured to be bonded with the bump CP of the light emitting unit LE for being electrically connected to the light emitting unit LE, and the connecting part CTR is configured to be electrically connected to the driving circuit. In this embodiment, the bonding pads BP include the bonding part BR and the connecting part CTR, but not limited thereto. In detail, the bonding pads BP of this embodiment may include a first bonding pad BP1, a second bonding pad BP2, a third bonding pad BP3 and a fourth bonding pad BP4. For example, the bonding part BR of the first bonding pad BP1 is electrically connected to the anode of the blue light-emitting diode chip through the bump CP, such that the blue light-emitting diode chip is electrically connected to the first circuit DC1 through the first bonding pad BP1; the bonding part BR of the second bonding pad BP2 is electrically connected to the anode of the green light-emitting diode chip through the bump CP, such that the green light-emitting diode chip is electrically connected to the second circuit DC2 through the second bonding pad BP2; the bonding part BR of the third bonding pad BP3 is electrically connected to the anode of the red light-emitting diode chip through the bump CP, such that the red light-emitting diode chip is electrically connected to the third circuit DC3 through the third bonding pad BP3; the bonding part BR of the fourth bonding pad BP4 is electrically connected to the cathode(s) of at least one of the light-emitting diode chips through the bump CP, so as to provide the cathode(s) of at least one of the light-emitting diode chips in the light emitting unit LE with a voltage (e.g., a ground voltage) through the fourth bonding pad BP4 (for example, a power source VEE is electrically connected to the light emitting unit LE through the fourth bonding pad BP4), but the connections of the bonding pads BP are not limited thereto. In addition, in the top view (corresponding to a top-view direction DO), the bonding parts BR may be respectively disposed at the different sides of the corresponding connecting parts CTR; for instance, in the embodiment shown in FIG. 1, the bonding parts BR of the bonding pads BP are respectively disposed at the down sides of the corresponding connecting parts CTR in the top view, but not limited thereto. In some embodiment of the present disclosure, the region of at least one of the bonding parts BR may be defined by an overlapping region of the bonding pad BP and the corresponding bump CP in the top view. Particularly, this overlapping region defined by the bonding part BR has a first length parallel to an extending direction of the data line DL and a second length perpendicular to the extending direction of the data line DL, and thus, the first length and the second length are characteristic lengths of the bonding part BR, but not limited thereto. In addition, an insulating cover layer COL may be optionally formed between the third conductive layer 180 and the light emitting unit LE, which protects the layers on the substrate 110. The insulating cover layer COL of this embodiment may cover the connecting part CTR of the bonding pad BP and expose the bonding part BR of the bonding pad BP. Note that the positions and types of the anode and the cathode of this embodiment are disclosed as an example, and the positions and types of the anode and the cathode in another embodiment may be modified based on the type of the light-emitting diode.

In general, the bumps CP of the light emitting unit LE may be disposed on the bonding pads BP by, for example, a bonding process, such that the bumps CP of the light emitting unit LE and the bonding pads BP are electrically connected respectively. However, since a heating step or a pressing step may be applied on the bumps CP during the bonding process, if the electronic component of the circuit (e.g., the switching component SU or the capacitor Cst) is disposed below the bonding part BR of the bonding pad BP according to the top view, this electronic component of the circuit may be damaged during the bonding process, so as to damage the circuit. In order to reduce the possibility of the above situation, in the present disclosure, at least a portion of the first circuit DC1 is located between two of the bonding pads BP in the top view, at least a portion of the second circuit DC2 is located between two of the bonding pads BP in the top view, and at least a portion of the third circuit DC3 is located between two of the bonding pads BP in the top view. In this embodiment, the first circuit DC1, the second circuit DC2 and the third circuit DC3 may be respectively located between two of the bonding pads BP in the top view. For instance, in FIG. 1, the first circuit DC1 may be located between the first bonding pad BP1 and the fourth bonding pad BP4 (or may be regarded as being located between the first bonding pad BP1 and the second bonding pad BP2 or being located between the first bonding pad BP1 and the third bonding pad BP3), the second circuit DC2 may be located between the third bonding pad BP3 and the fourth bonding pad BP4 (or may be regarded as being located between the first bonding pad BP1 and the fourth bonding pad BP4 or being located between the second bonding pad BP2 and the fourth bonding pad BP4), and the third circuit DC3 may be located between the third bonding pad BP3 and the fourth bonding pad BP4, but not limited thereto. In other words, the first circuit DC1, the second circuit DC2 and the third circuit DC3 do not overlap the bonding parts BR of the bonding pads BP in the top view, and therefore, the electronic components such as the switching components SU (i.e., the driving transistors DT and the switching transistors ST of this embodiment) and the capacitors Cst of the circuits do not overlap the bonding parts BR in the top view. In this design, when disposing the light emitting unit LE on the bonding pads BP, the possibility to damage the driving circuit (such as the first circuit DC1, the second circuit DC2 and the third circuit DC3) due to this process is decreased, or enhances the yield rate of the light emitting structure 100. In this embodiment, since the first circuit DC1, the second circuit DC2 and the third circuit DC3 are located between two of the bonding pads BP bonded with the same light emitting unit LE, after bonding the light emitting unit LE, the light emitting unit LE may at least partially overlap the first circuit DC1, the second circuit DC2 and the third circuit DC3 in the top view, as shown in FIG. 2. In this design, less additional area for disposing the first circuit DC1, the second circuit DC2, and the third circuit DC3 in the top view is required in the light emitting structure 100, and thus, the area of the structure unit may be reduced. If the light emitting unit LE is configured to be a display unit of the display device, this design may reduce the distance between two adjacent light emitting units LE.

Moreover, in order to make the first circuit DC1, the second circuit DC2 and the third circuit DC3 be located between the bonding pads BP and be respectively electrically connected to the corresponding bonding pads BP, the first circuit DC1 may be electrically connected to the connecting part CTR of the first bonding pad BP1 through a first bridge line BT1, the second circuit DC2 may be electrically connected to the connecting part CTR of the second bonding pad BP2 through a second bridge line BT2, and the third circuit DC3 may be electrically connected to the connecting part CTR of the third bonding pad BP3 through a third bridge line BT3, wherein the first bridge line BT1, the second bridge line BT2 and the third bridge line BT3 may cross over at least one of the circuits and/or at least one of the connecting lines based on requirements. The first bridge line BT1, the second bridge line BT2, the third bridge line BT3, and bonding pads BP may comprise the same layer(s) or different layer(s). In this embodiment, the first bridge line BT1, the second bridge line BT2 and the third bridge line BT3 may comprise at least one of the conductive layers, and these bridge lines may overlap the connecting parts CTR in the top view and be electrically connected to the connecting parts CTR through a plurality of through holes. For example, the first bridge line BT1 and the third bridge line BT3 may comprise the second conductive layer 160, and the second bridge line BT2 may comprise at least one wiring of the first conductive layer 140, at least one wiring of the second conductive layer 160 and at least one conductive structure connected between two of the wirings, so as to cross over the connecting lines such as the data lines DL, the scan lines and/or the power lines PL, but not limited thereto.

The light emitting structure and the electronic device of the present disclosure are not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 4:
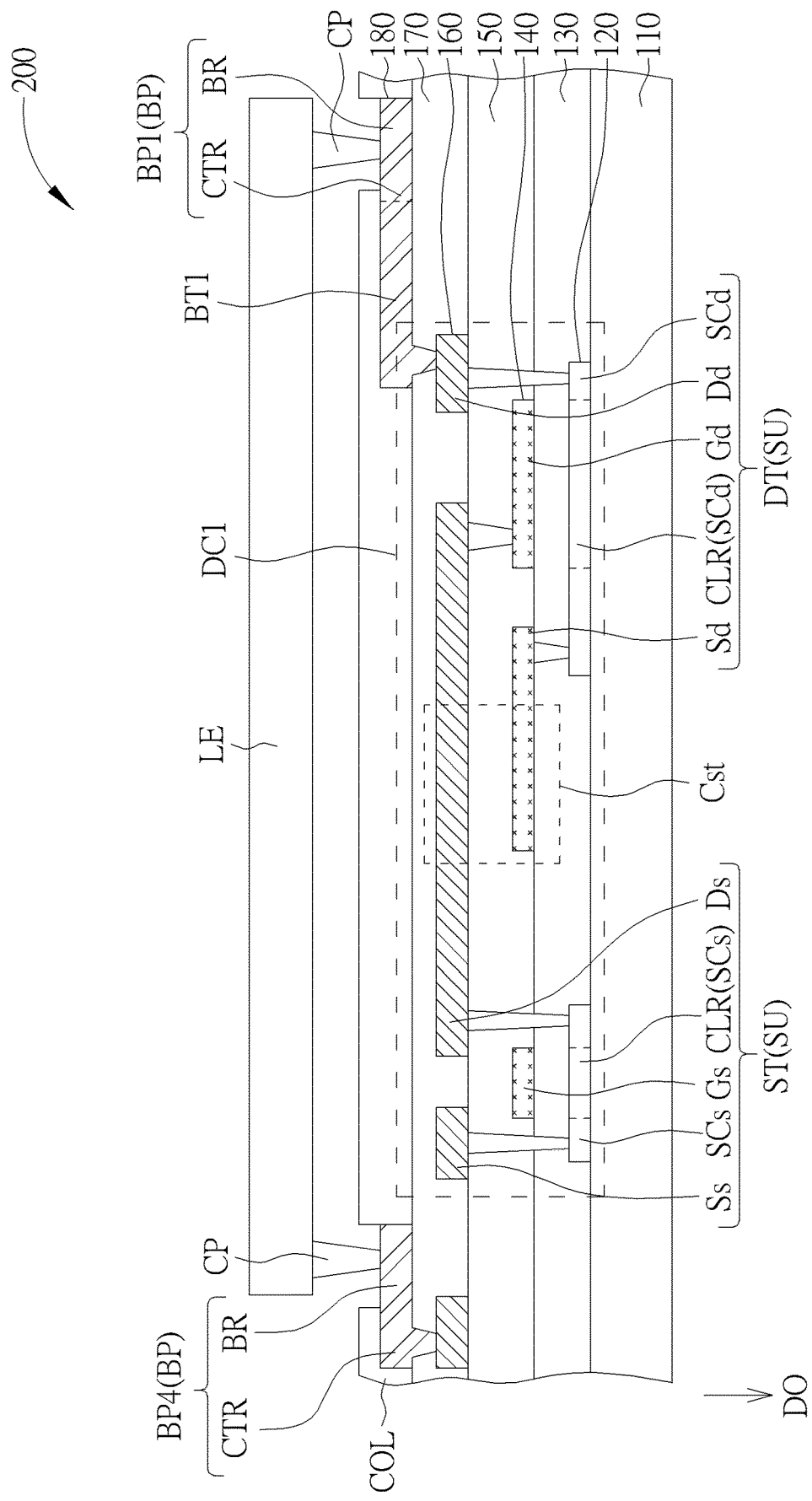
FIG. 4 is a schematic diagram showing a cross-sectional view of an electronic device according to a second embodiment of the present disclosure.

Referring to FIG. 4, FIG. 4 is a schematic diagram showing a cross-sectional view of an electronic device according to a second embodiment of the present disclosure. As shown in FIG. 4, a difference between this embodiment and the first embodiment is that the first bridge line BT1, the second bridge line BT2 and/or the third bridge line BT3 of the light emitting structure 200 of this embodiment may comprise the conductive layer the same as the conductive layer of the bonding pads BP. For instance, at least one of the bridge lines comprises the third conductive layer 180. Note that, since the first bridge line BT1 is electrically connected between the connecting part CTR of the first bonding pad BP1 and the first circuit DC1, a portion of the first bonding pad BP1 connected to the first bridge line BT1 can be regarded as the connecting part CTR of the first bonding pad BP1. Similarly, a portion of the second bonding pad BP2 connected to the second bridge line BT2 can be regarded as the connecting part CTR of the second bonding pad BP2, and a portion of the third bonding pad BP3 connected to the third bridge line BT3 can be regarded as the connecting part CTR of the third bonding pad BP3.

Figure 5:
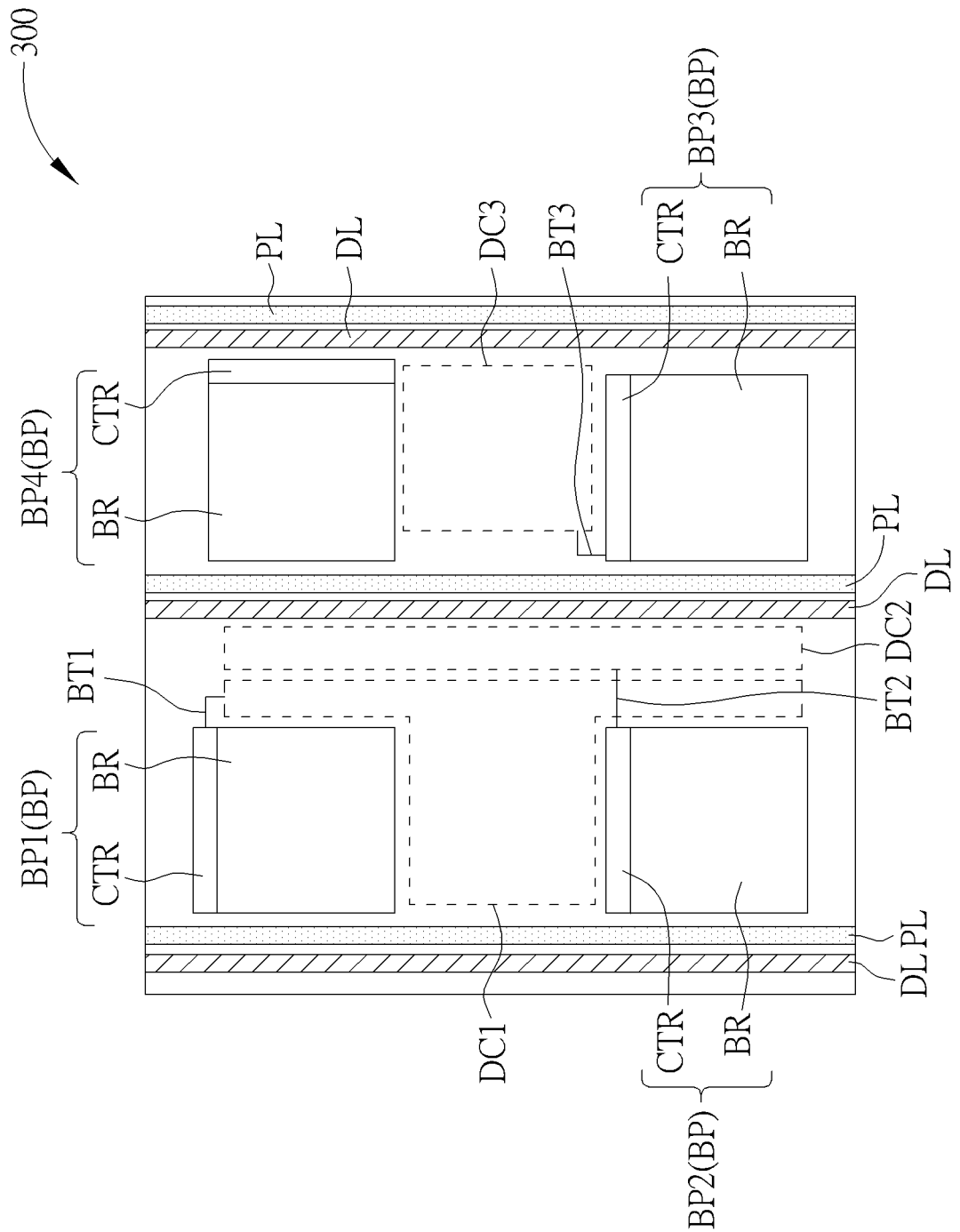
FIG. 5 is a schematic diagram showing a top view of an electronic device according to a third embodiment of the present disclosure.

Referring to FIG. 5, FIG. 5 is a schematic diagram showing a top view of an electronic device according to a third embodiment of the present disclosure. In FIG. 5, it omits the electronic components and the wirings of the first circuit DC1, the second circuit DC2 and the third circuit DC3, so as to clearly show the disposing ranges of the first circuit DC1, the second circuit DC2 and the third circuit DC3. As shown in FIG. 5, in the light emitting structure 300 of this embodiment, a difference between this embodiment and the first embodiment is that the relative position between the bonding part BR and the connecting part CTR of one bonding pad BP may be different from the relative position between the bonding part BR and the connecting part CTR of another bonding pad BP. In the top view, the connecting part CTR of the fourth bonding pad BP4 is disposed between the bonding part BR of the fourth bonding pad BP4 and the data line DL, the connecting part CTR of the first bonding pad BP1 is disposed between the bonding part BR of the first bonding pad BP1 and a second bonding pad of another light emitting unit (not shown in figures) which is adjacent to this light emitting unit along the extending direction of the data line DL, the connecting part CTR of the second bonding pad BP2 is disposed between the bonding part BR of the second bonding pad BP2 and a horizontal protrusion portion of the first circuit DC1, and the connecting part CTR of the third bonding pad BP3 is disposed between the bonding part BR of the third bonding pad BP3 and the third circuit DC3, but not limited thereto. Moreover, in this embodiment, the disposing positions of the circuits may be different from the first embodiment. In detail, in the top view shown in FIG. 5, the first circuit DC1 may have a portion located between the first bonding pad BP1 and the second bonding pad BP2, a portion located between the first bonding pad BP1 and the fourth bonding pad BP4 and a portion located between the second bonding pad BP2 and the third bonding pad BP3; the second circuit DC2 may have a portion located between the first bonding pad BP1 and the fourth bonding pad BP4 and a portion located between the second bonding pad BP2 and the third bonding pad BP3; the third circuit DC3 is located between the third bonding pad BP3 and the fourth bonding pad BP4, but not limited thereto.

Figure 6:
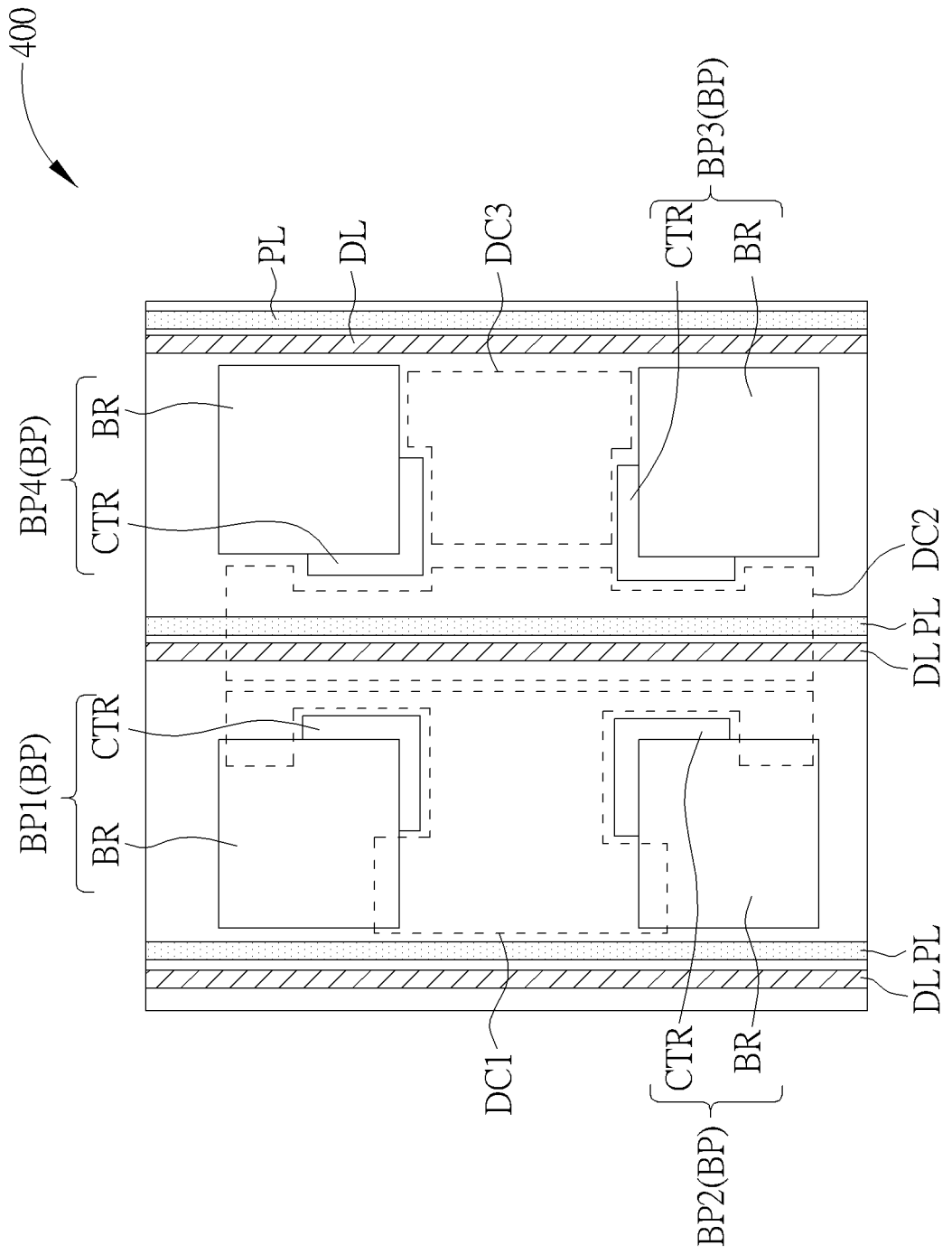
FIG. 6 is a schematic diagram showing a top view of an electronic device according to a fourth embodiment of the present disclosure.
Figure 7:
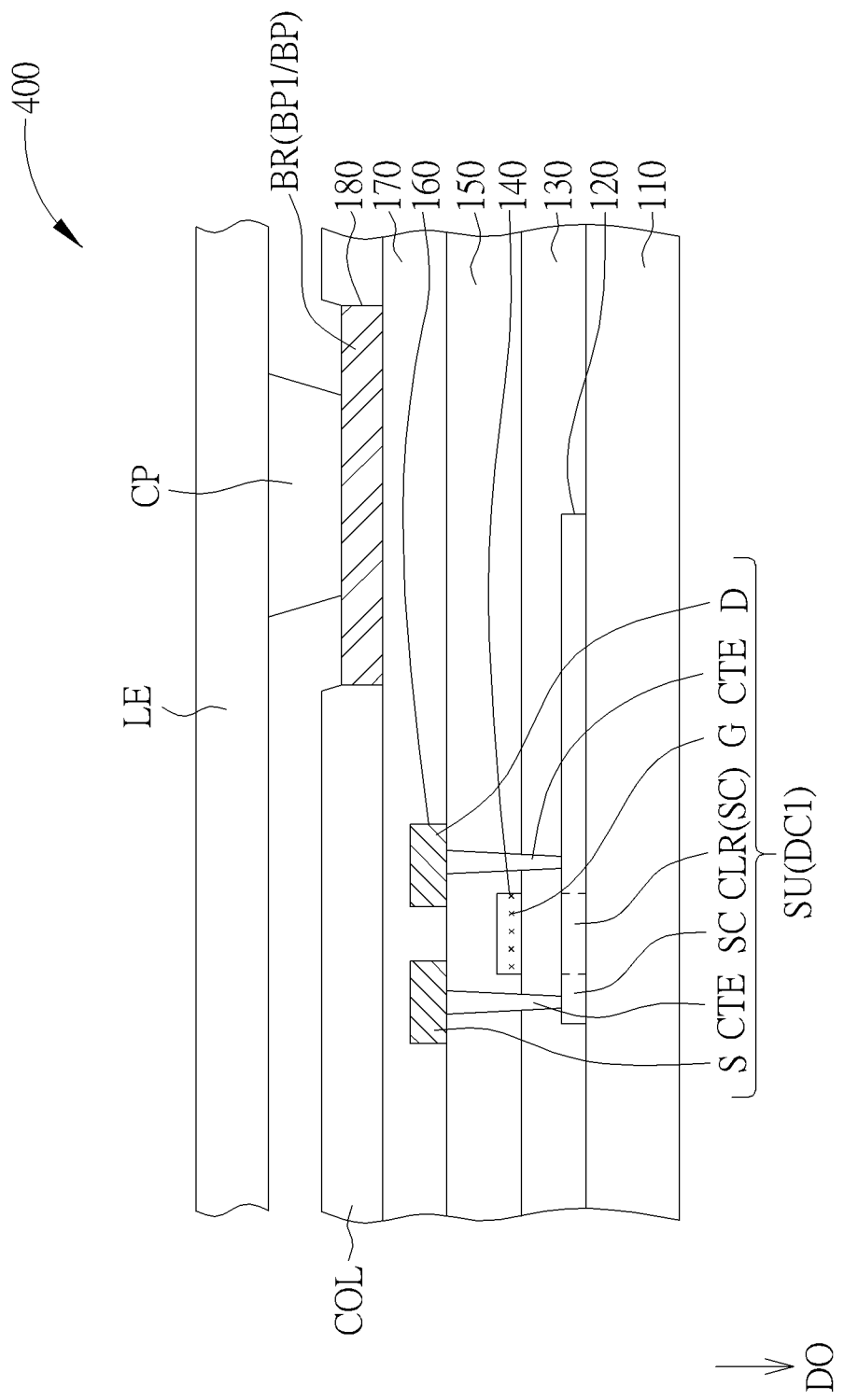
FIG. 7 is a schematic diagram showing a cross-sectional view of the electronic device according to the fourth embodiment of the present disclosure.

Referring to FIG. 6 and FIG. 7, FIG. 6 is a schematic diagram showing a top view of an electronic device according to a fourth embodiment of the present disclosure, and FIG. 7 is a schematic diagram showing a cross-sectional view of the electronic device according to the fourth embodiment of the present disclosure. In FIG. 6, it omits the electronic components and the wirings of the first circuit DC1, the second circuit DC2 and the third circuit DC3, and omits the bridge lines, so as to clearly show the positions of the first circuit DC1, the second circuit DC2 and the third circuit DC3. FIG. 7 only shows the switching component SU of the first circuit DC1, the bonding part BR of one bonding pad BP and a portion of the light emitting unit LE. As shown in FIG. 6 and FIG. 7, a difference between this embodiment and the first embodiment is that a portion of at least one of the circuits of the light emitting structure 400 of this embodiment overlaps the bonding part(s) BR of the bonding pad(s) BP in the top view. For instance, in FIG. 6, a portion of the first circuit DC1 may overlap the bonding part BR of the bonding pad BP in the top view, another portion of the first circuit DC1 may be located between the bonding pads BP in the top view, and the second circuit DC2 and the third circuit DC3 are located between the bonding pads BP in the top view, but not limited thereto. In some embodiments, at least one of the circuits (e.g., the first circuit DC1, the second circuit DC2 and/or the third circuit DC3) may partially overlap the bonding part(s) BR of the bonding pad(s) BP in the top view. Particularly, the fragile structures, the fragile components and/or the functional structures in the circuit cannot overlap the bonding part BR of the bonding pad BP in the top view, so as to reduce the damage of the circuits during disposing the light emitting unit LE. For example, in the first circuit DC1 of this embodiment, the switching component(s) SU (such as the driving transistor DT and/or the switching transistor ST) do not overlap the bonding part BR of the bonding pad BP in the top view, and other structures and other components in the first circuit DC1 may overlap or may not overlap the bonding part BR, but not limited thereto. Note that, the switching component SU of this embodiment does not overlap the bonding part BR of the bonding pad BP in the top view, which represents that a main portion of the switching component SU (i.e., the channel region CLR of the channel layer SC, a contact terminal CTE between the source electrode S and the channel layer SC, and a contact terminal CTE between the drain electrode D and the channel layer SC of the switching component SU) does not overlap the bonding part BR of the bonding pad BP in the top view. As shown in FIG. 7, in this embodiment, a portion of the semiconductor layer 120 of the switching component SU may overlap the bonding part(s) BR of the bonding pad(s) BP in the top view, but not limited thereto. In another embodiment, any conductive layer in the switching component SU may overlap the bonding part(s) BR of the bonding pad(s) BP in the top view. In another embodiment, the channel region CLR of the switching component SU does not overlap the bonding part BR of the bonding pad BP in the top view, and the drain electrode D and/or the source electrode S may overlap the bonding part(s) BR in the top view. In another embodiment, the switching component(s) SU and the passive component(s) (e.g., the capacitor Cst) of the first circuit DC1 do not overlap the bonding part BR in the top view, and other structures and other components (e.g., the wirings) may optionally overlap the bonding part BR in the top view. Furthermore, an ratio of an overlapping area of the bonding part BR and the first circuit DC1 to an area of the bonding part BR may be greater than or equal to 0 and less than or equal to 0.5 (0≤this ratio≤0.5), greater than or equal to 0 and less than or equal to 0.3 (0≤this ratio≤0.3), or greater than or equal to 0 and less than or equal to 0.1 (0≤this ratio≤0.1), but not limited thereto.

On the other hand, another difference between this embodiment and the first embodiment is that the connecting part CTR of the bonding pad BP of the light emitting structure 400 of this embodiment may be disposed outside the bonding part BR and may have a L-shape, and the connecting part CTR is disposed between two bonding parts BR corresponding to the same light emitting unit LE in the top view, but not limited thereto. Moreover, the second circuit DC2 of this embodiment may cross over the connecting lines (e.g., the data lines DL and the power lines PL in FIG. 6) in the top view, but not limited thereto.

Figure 8:
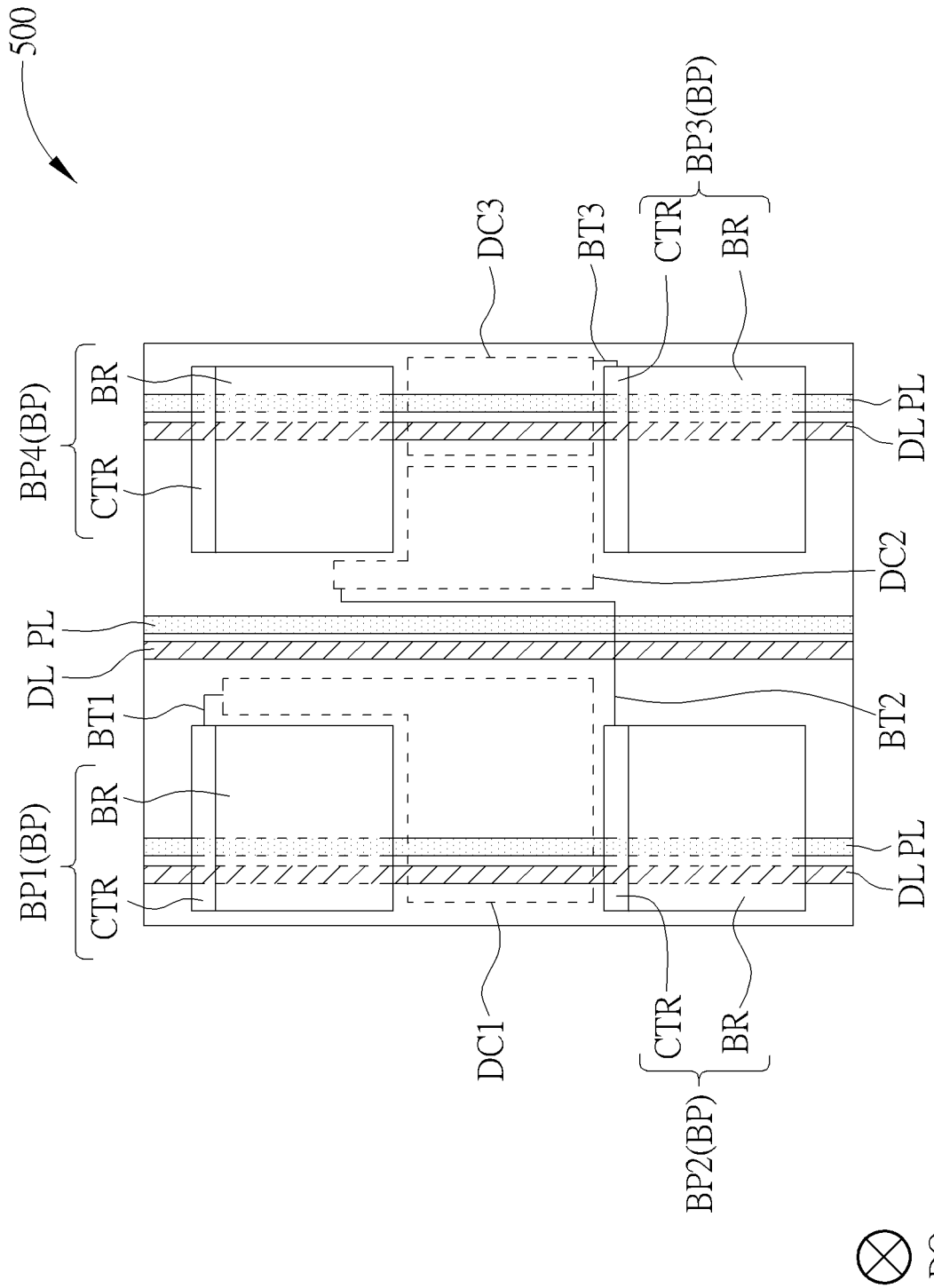
FIG. 8 is a schematic diagram showing a top view of an electronic device according to a fifth embodiment of the present disclosure.

Referring to FIG. 8, FIG. 8 is a schematic diagram showing a top view of an electronic device according to a fifth embodiment of the present disclosure, In FIG. 8, it omits the electronic components and the wirings of the first circuit DC1, the second circuit DC2 and the third circuit DC3, so as to clearly show the positions of the first circuit DC1, the second circuit DC2 and the third circuit DC3. As shown in FIG. 8, a difference between this embodiment and the first embodiment is that at least one of the connecting lines of the light emitting structure 500 of this embodiment may cross over at least one of the bonding pads BP in the top view. For instance, in FIG. 8, one of the data lines DL and one of the power lines PL cross over two of the bonding pads BP, but not limited thereto. That is to say, in this embodiment, the bonding part(s) BR of the bonding pad(s) BP may overlap at least one of the connecting lines in the top view.

Figure 9:
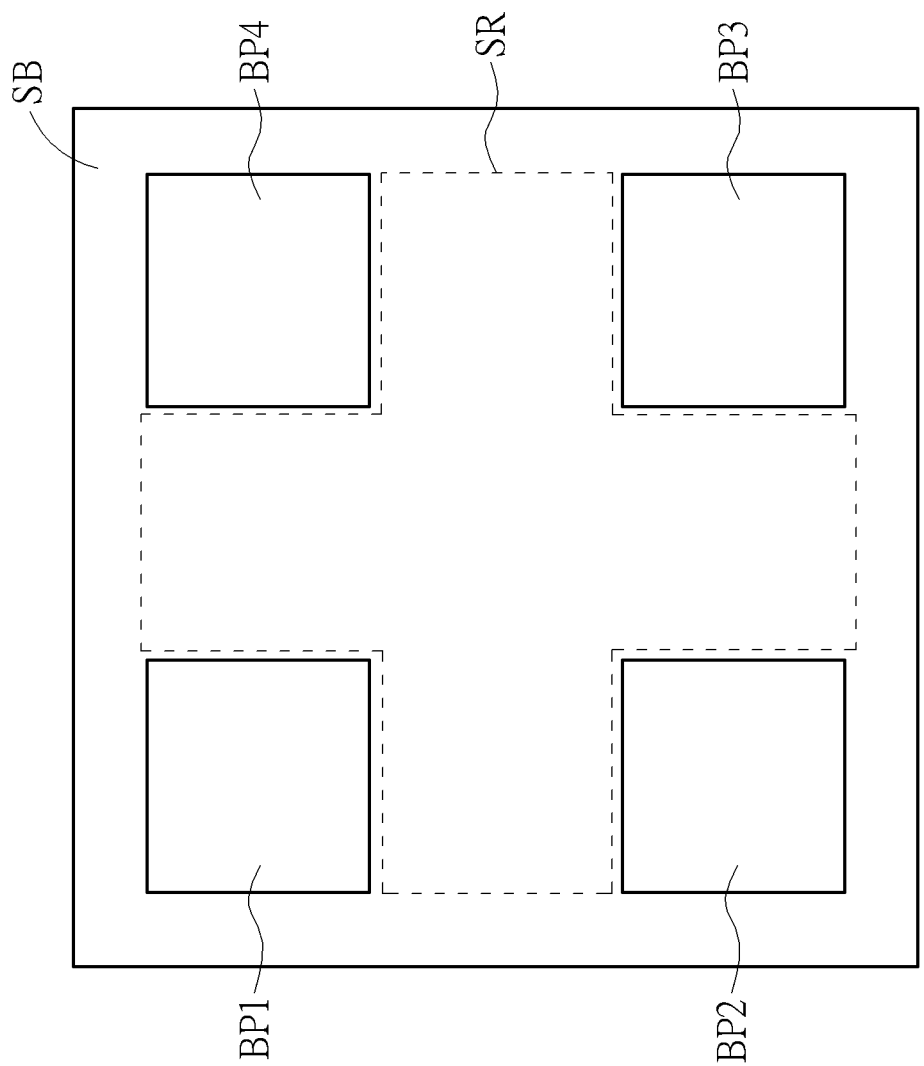
FIG. 9 is a schematic diagram showing a top view of an electronic device according to an embodiment of the present disclosure.
Figure 9:

Referring to FIG. 9, FIG. 9 is a schematic diagram showing a top view of an electronic device according to an embodiment of the present disclosure. According to the light emitting structure of the above embodiments, under the consideration that the space below the light emitting unit LE is well utilized, the fragile structures and/or the fragile components in the circuit may be disposed within a safe zone SR shown in FIG. 9, wherein the fragile structures and/or the fragile components in the circuit may be such as the switching component SU or the channel region CLR. The safe zone SR is located between the bonding pads BP in the top view, such that the fragile structures and/or the fragile components in the circuit do not overlap the bonding part BR of the bonding pad BP in the top view, so as to reduce the damage of the circuits during disposing the light emitting unit LE. In some embodiments, any other active component or any other passive component, such as the capacitor Cst, may be disposed within the safe zone SR. In some embodiments, the fragile structures, the fragile components and any other portion in the circuit driving the light emitting unit LE are disposed within the safe zone SR, for example, partial area(s) and/or total area(s) of the first circuit DC1, the second circuit DC2 and the third circuit DC3 may be disposed within the safe zone SR. In some embodiments, at least one of the connecting lines may be disposed within the safe zone SR, but not limited thereto.

Figure 10:
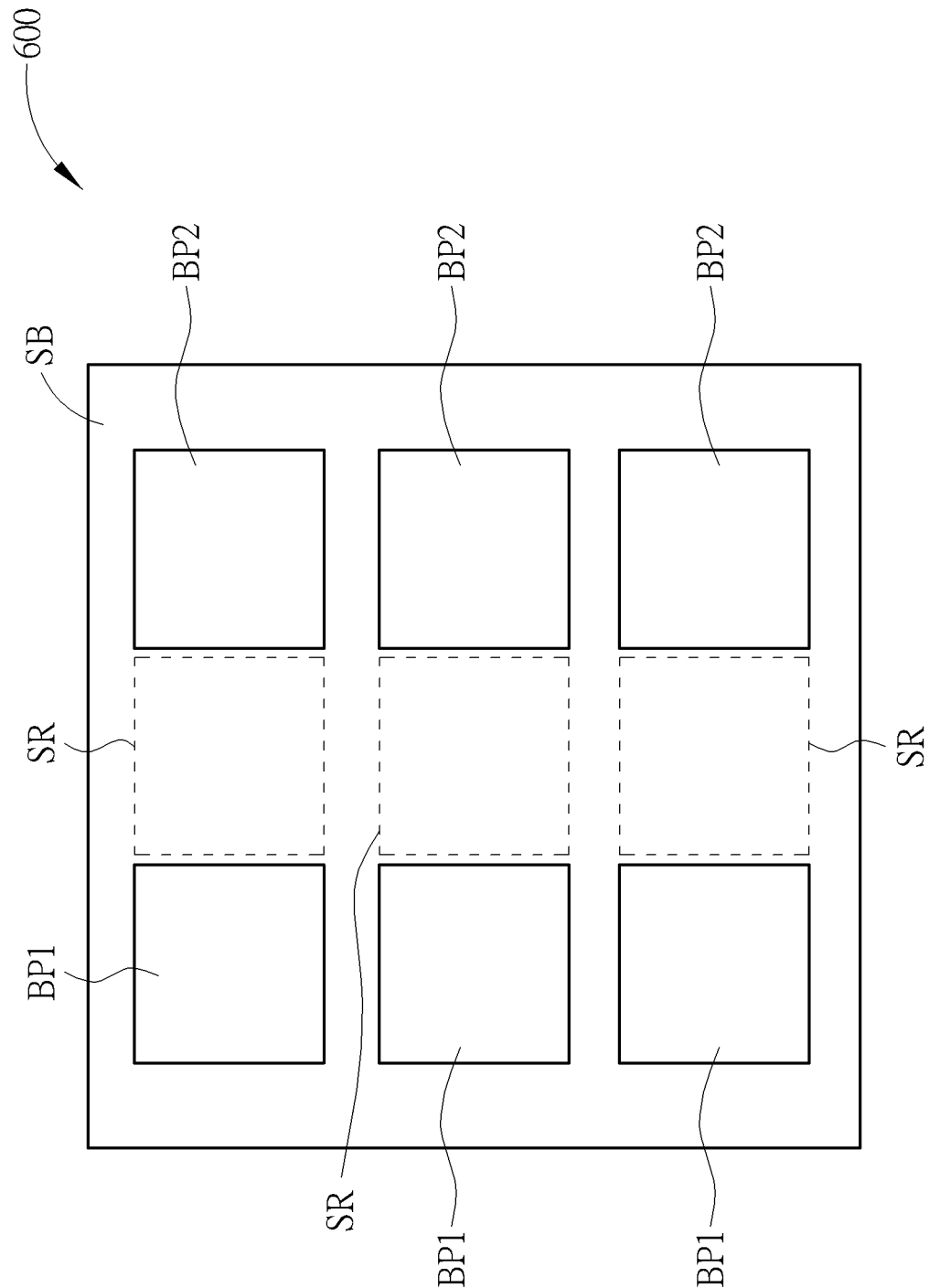
FIG. 10 is a schematic diagram showing a top view of an electronic device according to a sixth embodiment of the present disclosure.

Referring to FIG. 10, FIG. 10 is a schematic diagram showing a top view of an electronic device according to a sixth embodiment of the present disclosure, wherein FIG. 10 shows the bonding pads BP and the safe zones SR located between the bonding pads BP, and shows the light emitting structure 600 with a demanded range for disposing three light emitting units LE. As shown in FIG. 10, each light emitting unit LE of this embodiment may have two bumps CP. The bonding pads BP in the structure unit may include a plurality of first bonding pads BP1 and a plurality of second bonding pads BP2. The two bumps CP of each light emitting unit LE may be electrically connected to the anode and the cathode of the light-emitting diode chip included in the light emitting unit LE respectively, the bumps CP may also be respectively corresponding to one of the first bonding pads BP1 and one of the second bonding pads BP2, and may be horizontally disposed in FIG. 10. The light emitting unit LE of this embodiment may emit the monochromatic light; for example, the light emitting unit LE corresponding to the first bonding pad BP1 and the second bonding pad BP2 shown in the upper portion of FIG. 10 may emit blue light, the light emitting unit LE corresponding to the first bonding pad BP1 and the second bonding pad BP2 shown in the middle portion of FIG. 10 may emit green light, and the light emitting unit LE corresponding to the first bonding pad BP1 and the second bonding pad BP2 shown in the lower portion of FIG. 10 may emit red light, but not limited thereto. In this embodiment, at least a portion of the first circuit DC1 may be disposed within the safe zone SR between the first bonding pad BP1 and the second bonding pad BP2 shown in the upper portion of FIG. 10, so as to drive the light emitting unit LE to emit the blue light; at least a portion of the second circuit DC2 may be disposed within the safe zone SR between the first bonding pad BP1 and the second bonding pad BP2 shown in the middle portion of FIG. 10, so as to drive the light emitting unit LE to emit the green light; at least a portion of the third circuit DC3 may be disposed within the safe zone SR between the first bonding pad BP1 and the second bonding pad BP2 shown in the lower portion of FIG. 10, so as to drive the light emitting unit LE to emit the red light. The disposition of the structures and/or the components in the circuits within the safe zones SR may be referred to the above embodiments, and will not be redundantly described.

Figure 11:
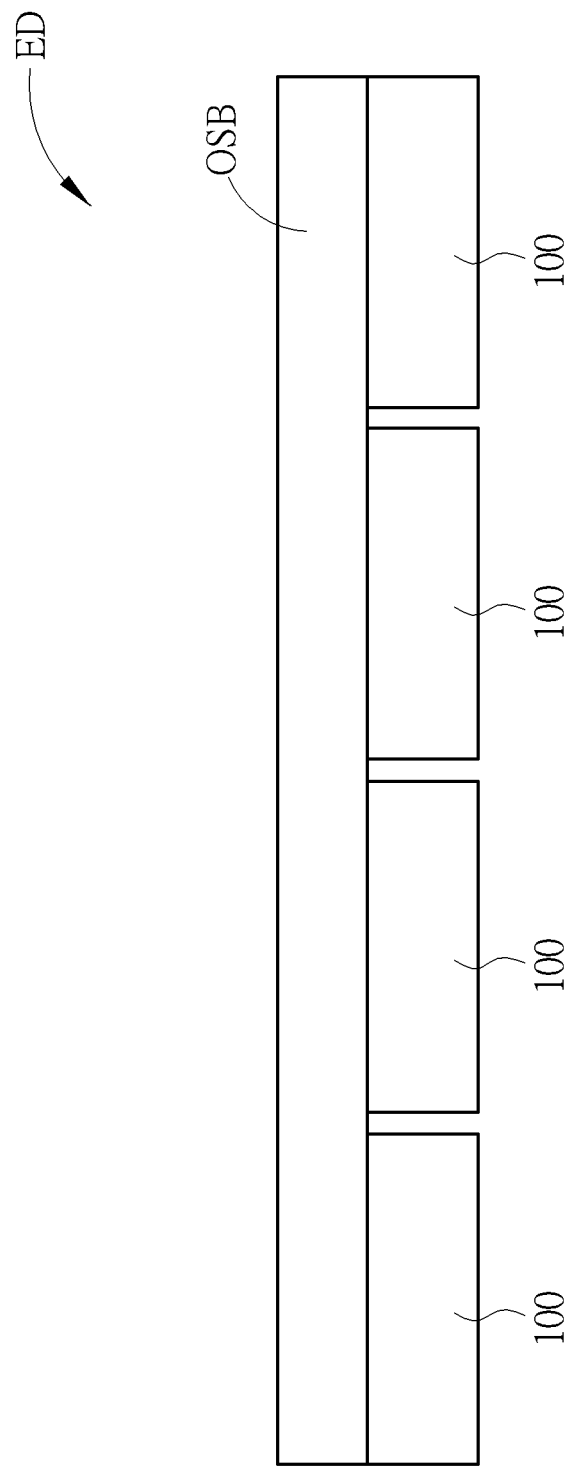
FIG. 11 is a schematic diagram showing a cross-sectional view of an electronic device according to a seventh embodiment of the present disclosure.

Referring to FIG. 11, FIG. 11 is a schematic diagram showing a cross-sectional view of an electronic device according to a seventh embodiment of the present disclosure. As shown in FIG. 11, the electronic device ED may include one or more light emitting structure(s) and an opposite substrate OSB, wherein the light emitting structure may be one of the above embodiments or their modified embodiments. For example, in FIG. 11, the light emitting structure 100 is the light emitting structure of the first embodiment. In this embodiment, the electronic device ED may include a plurality of light emitting structures 100, and the opposite substrate OSB may be disposed adjacent to the light emitting structures 100, so as to form a tiled electronic device ED. For instance, the electronic device ED of this embodiment may be a public information display, and the light emitting structures 100 may be served as an array substrate of the display device to emit the corresponding light for displaying images, but not limited thereto. In a variant embodiment, the electronic device ED may include one light emitting structure 100 and the opposite substrate OSB, and the opposite substrate OSB may be disposed adjacent to this light emitting structure 100. In another variant embodiment, the electronic device ED may include one light emitting structure 100 and not include the opposite substrate OSB, and the light emitting structure 100 may be directly encapsulated to form the electronic device ED.

Figure 12:
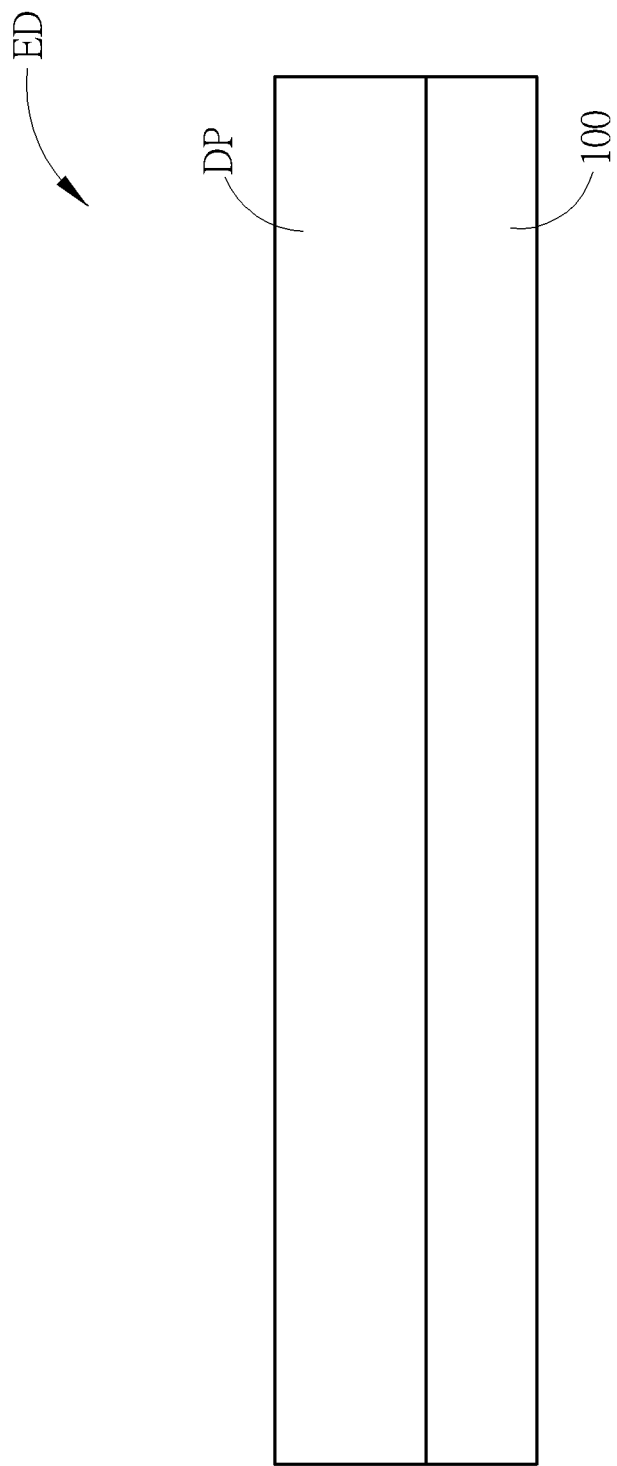
FIG. 12 is a schematic diagram showing a cross-sectional view of an electronic device according to an eighth embodiment of the present disclosure.

Referring to FIG. 12, FIG. 12 is a schematic diagram showing a cross-sectional view of an electronic device according to an eighth embodiment of the present disclosure. As shown in FIG. 12, the electronic device ED may include one or more light emitting structure(s) 100 and a non-self-luminous panel DP, wherein the light emitting structure may be one of the above embodiments or their modified embodiments. For example, in FIG. 12, the light emitting structure is the light emitting structure 100 of the first embodiment. In this embodiment, the electronic device ED may include one light emitting structure 100, and the panel DP is disposed on the light emitting structure 100 to form an electronic device ED. For instance, the electronic device ED may be a display device, wherein the light emitting structure 100 may be served as a backlight module of the display device, such that the display device may control the transmittance of the panel DP and utilize the light emitted from the light emitting structure 100 (backlight module) to display images, but not limited thereto. The non-self-luminous panel DP may be such as a liquid crystal panel, but not limited thereto. In a variant embodiment, the electronic device ED may include a plurality of light emitting structures 100 and the panel DP, and the panel DP may be disposed on the light emitting structures 100. In another variant embodiment, the electronic device ED may be formed by integrating a plurality of panels DP, wherein the panels DP may be disposed on one or more light emitting structure(s) 100. In some embodiments of the present disclosure, the integrating method of the panels PD may be used in a curved tiled device, a flexible tiled device, a special-shaped tiled device, etc., but not limited thereto.

To summarize, since the fragile structure(s) and/or the fragile component(s) in the driving circuit of the present disclosure is located between the bonding pads in the top view, during the disposing process of the light emitting unit, the possibility to damage the fragile structure(s) and/or the fragile component(s) due to the heating step or the pressing step is decreased. Thus, the reliability of the circuit or the yield rate of the electronic device can be enhanced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a substrate;
   a first circuit disposed on the substrate;
   a plurality of bonding pads disposed on the substrate, wherein at least one of the bonding pads comprises a bonding part and a connecting part, the bonding part and the connecting part are made of a same conductive layer, and the bonding part is electrically connected to the first circuit through the connecting part;
   a light emitting unit disposed on the substrate and corresponding to the bonding part, and the light emitting unit being electrically connected to the first circuit through at least one of the bonding pads; and
   a connecting line, wherein the first circuit is electrically connected to a power source or a chip through the connecting line, the connecting line partially overlaps at least two of the bonding pads in a top view, and the connecting line crosses over the at least two of the bonding pads in the top view;
   wherein at least a portion of the first circuit is located between two of the bonding pads in the top view.

2. The electronic device according to claim 1, wherein the first circuit does not overlap the bonding part in the top view.

3. The electronic device according to claim 1, wherein the first circuit comprises a switching component, and the switching component does not overlap the bonding part in the top view.

4. The electronic device according to claim 1, wherein the first circuit comprises a switching component, the switching component comprises a gate electrode and a channel layer, the channel layer has a channel region corresponding to the gate electrode, and the channel region does not overlap the bonding part in the top view.

5. The electronic device according to claim 1, wherein the first circuit comprises a switching component and a capacitor, and the capacitor is electrically connected to the switching component.

6. The electronic device according to claim 5, wherein the capacitor does not overlap the bonding part in the top view.

7. The electronic device according to claim 5, further comprising an insulating cover layer formed between the capacitor and the light emitting unit.

8. The electronic device according to claim 7, wherein the insulating cover layer covers the connecting part and exposes the bonding part.

9. The electronic device according to claim 1, further comprising a second circuit, wherein at least a portion of the second circuit is located between two of the bonding pads in the top view, and the light emitting unit is electrically connected to the second circuit through at least one of the bonding pads.

10. The electronic device according to claim 1, wherein a ratio of an overlapping area of the bonding part and the first circuit to an area of the bonding part is greater than or equal to 0 and less than or equal to 0.5.

11. The electronic device according to claim 1, wherein the light emitting unit overlaps the first circuit in the top view.

12. The electronic device according to claim 1, wherein the light emitting unit comprises a first light-emitting diode chip and a second light-emitting diode chip.

13. The electronic device according to claim 12, wherein the first light-emitting diode chip and the second light-emitting diode chip emit lights with different colors.

14. The electronic device according to claim 12, wherein the light emitting unit emits a monochromatic light or a mixed light.

15. The electronic device according to claim 1, further comprising a non-self-luminous panel disposed on the light emitting unit.

16. An electronic device, comprising:
    a first light emitting structure, comprising:
        a substrate;
        a first circuit disposed on the substrate;
        a plurality of bonding pads disposed on the substrate, wherein at least a portion of the first circuit is located between two of the bonding pads in a top view, at least one of the bonding pads comprises a bonding part and a connecting part, the bonding part and the connecting part are made of a same conductive layer, and the bonding part is electrically connected to the first circuit through the connecting part;
        a light emitting unit disposed on the substrate and corresponding to the bonding part, and the light emitting unit being electrically connected to the first circuit through at least one of the bonding pads; and
        a connecting line, wherein the first circuit is electrically connected to a power source or a chip through the connecting line, the connecting line partially overlaps at least two of the bonding pads in the top view, and the connecting line crosses over the at least two of the bonding pads in the top view; and
    an opposite substrate disposed adjacent to the first light emitting structure.

17. The electronic device according to claim 16, further comprising a second light emitting structure disposed adjacent to the first light emitting structure and the opposite substrate.

18. The electronic device according to claim 17, wherein the electronic device is a tiled electronic device.

19. The electronic device according to claim 16, wherein the first circuit comprises a switching component, the switching component comprises a gate electrode and a channel layer, the channel layer has a channel region corresponding to the gate electrode, and the channel region does not overlap the bonding part in the top view.

* * * * *